(12) United States Patent
Wan et al.

(10) Patent No.: US 10,780,682 B2
(45) Date of Patent: Sep. 22, 2020

(54) LIQUID ADHESION COMPOSITION, MULTI-LAYER STRUCTURE AND METHOD OF MAKING SAID STRUCTURE

(71) Applicant: CANON KABUSHIKI KAISHA, Tokyo (JP)

(72) Inventors: Fen Wan, Austin, TX (US); Weijun Liu, Cedar Park, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 22 days.

(21) Appl. No.: 16/228,228

(22) Filed: Dec. 20, 2018

(65) Prior Publication Data

US 2020/0198311 A1 Jun. 25, 2020

(51) Int. Cl.
| | |
|---|---|
| *C08G 18/00* | (2006.01) |
| *B32B 27/30* | (2006.01) |
| *B32B 7/05* | (2019.01) |
| *C09J 179/00* | (2006.01) |
| *C08K 5/17* | (2006.01) |
| *H05K 1/03* | (2006.01) |

(52) U.S. Cl.
CPC .............. *B32B 27/308* (2013.01); *B32B 7/05* (2019.01); *C09J 179/00* (2013.01); *B32B 2457/08* (2013.01); *C08K 5/17* (2013.01); *H05K 1/036* (2013.01)

(58) Field of Classification Search
CPC ...... C08G 18/3256; C08G 59/40; C08G 8/04; C08G 8/08; C09J 161/14
See application file for complete search history.

(56) References Cited

U.S. PATENT DOCUMENTS

| | | | |
|---|---|---|---|
| 8,557,351 B2 | 10/2013 | Xu | |
| 10,073,341 B2 | 9/2018 | Honma | |
| 2007/0017631 A1* | 1/2007 | Xu | .......................... B82Y 10/00 156/272.2 |
| 2007/0021520 A1 | 1/2007 | Xu | |
| 2007/0212494 A1 | 9/2007 | Xu | |
| 2009/0155583 A1 | 6/2009 | Xu | |
| 2014/0034229 A1 | 2/2014 | Xu | |
| 2015/0014819 A1 | 1/2015 | Hattori | |
| 2015/0079793 A1 | 3/2015 | Hattori | |

FOREIGN PATENT DOCUMENTS

| | | |
|---|---|---|
| JP | 2018002814 A | 1/2018 |
| WO | 2009085090 A1 | 7/2009 |
| WO | 2014120644 A1 | 8/2014 |

* cited by examiner

*Primary Examiner* — Kuo Liang Peng
(74) *Attorney, Agent, or Firm* — Abel Schillinger, LLP

(57) ABSTRACT

A liquid adhesion composition can include at least one polymerizable compound comprising at least two functional groups; a solvent; a catalyst; and a cross-linking agent, wherein the cross-linking agent can have a structure of Formula (1): A $[X-(O-Y-)_{n1}-N(CH_2-OR)_2]_{n2}$ (1), wherein A is an alkyl group, or an aromatic group, or a heteroaromatic group; X is $C_{1-5}$ alkyl, Y is $C_{1-4}$ linear or branched alkyl; $n_1$ is 1-10; R is $C_{1-6}$ alkyl; and $n_2$ is 1-6. The liquid adhesion composition can be cured at elevated temperatures and may be applied in nanoimprint lithography for attaching an imprint resist layer on a substrate.

19 Claims, 2 Drawing Sheets

LIQUID ADHESION COMPOSITION, MULTI-LAYER STRUCTURE AND METHOD OF MAKING SAID STRUCTURE

FIELD OF THE DISCLOSURE

The present disclosure relates to a liquid adhesion composition, particularly to a liquid adhesion composition for attaching a resist layer on a substrate in nanoimprint lithography.

RELATED ART

Spin-coatable adhesion materials in nanoimprint lithography have high quality requirements regarding stability, viscosity, and unwanted gelation or particle formation during processing.

There exists a need to further improve the quality of spin-coatable adhesion compositions.

SUMMARY

In one aspect, a liquid adhesion composition can comprise at least one polymerizable compound comprising at least two functional groups; a solvent; a catalyst; and a cross-linking agent, wherein the cross-linking agent can have a structure of Formula (1):

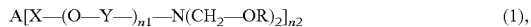

$$A[X-(O-Y-)_{n1}-N(CH_2-OR)_2]_{n2} \quad (1),$$

wherein A is an alkyl group, or an aromatic group, or a heteroaromatic group; X is $C_{1-5}$ alkyl, Y is $C_{1-4}$ linear or branched alkyl; $n_1$ is 1-10; R is $C_{1-6}$ alkyl, wherein each R can be the same or different; and $n_2$ is 1-6.

In a further aspect, the cross-linking agent of Formula (1) can have a structure wherein A is $C_{1-3}$ alkyl, Y is branched $C_{3-5}$ alkyl; R is $C_{1-3}$ alkyl, $n_1$ is 2-6, and $n_2$ is 2 or 3.

In yet a particular aspect, the cross-linking agent of the liquid adhesion composition can have a structure of Formula (2):

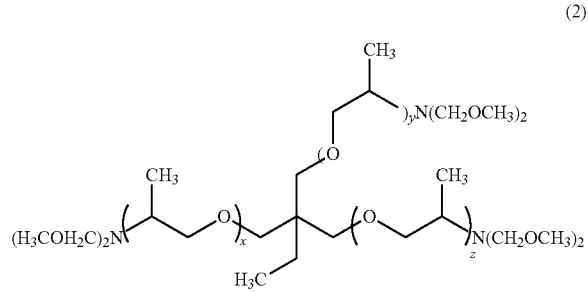

wherein x, y, z is 5 or 6, and a degree of —$CH_2OCH_3$ is at least 5.7 per mol.

In another aspect, the at least one polymerizable compound of the liquid adhesion composition can comprise a monomer, an oligomer, a polymer, or any combination thereof.

In a certain aspect, the polymerizable compound can include an acrylate oligomer.

In a particular aspect, the acrylate oligomer can include a structure of formula (3):

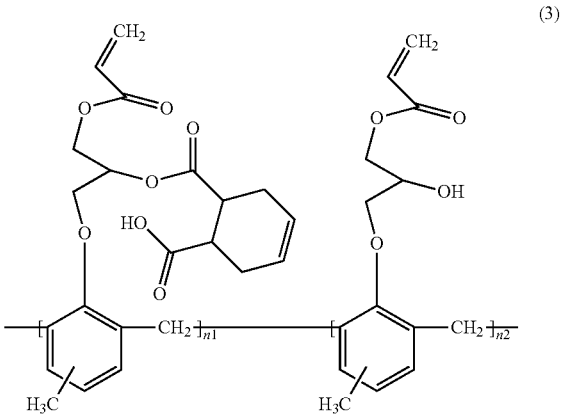

wherein $n_1+n_2>2$.

In yet a further aspect, the liquid adhesion composition can comprises per ml less than 50 particles with a particle size of greater than 200 nm.

In another aspect, the liquid adhesion composition can comprise a viscosity of not greater than 100 cP.

In a further aspect, the liquid adhesion composition can be cured at a temperature of at least 50° C.

In yet another aspect, a weight percent ratio of the amount of the polymerizable compound to the amount of cross-linking agent in the liquid adhesion composition can be at least 0.5 and not greater than 20.

In another aspect, a combined amount of the polymerizable compound and the cross-linking agent together can be at least 0.02 wt % and not greater than 10 wt % based on the total weight of the liquid adhesion composition.

In one aspect, the solvent of the liquid adhesion composition can comprise propylene glycol methyl ether acetate (PGMEA), propylene glycol methyl ether (PGME), cyclohexanol, or a combination thereof.

In another embodiment, a multi-layer structure can comprise a substrate, a solid adhesion layer directly overlying a surface of the substrate; and a solid polymeric layer directly overlying a surface of the adhesion layer, wherein the solid adhesion layer can comprise an oligomer or polymer cross-linked by a cross-linking agent. The cross-linking agent can have a chemical structure of Formula (1), wherein A is an alkyl or an aromatic group; X is $C_{1-5}$ alkyl, Y is $C_{1-4}$ linear or branched alkyl; $n_1$ is 1-10; R is $C_{1-6}$ alkyl; $n_2$ is 1-6.

In a certain aspect, the cross-linking agent of Formula (1) contained in the solid adhesion layer of the multi-layer structure can have a structure wherein A is $C_{1-3}$ alkyl, Y is branched $C_{3-5}$ alkyl; R is $C_{1-3}$ alkyl, $n_1$ is 2-6, and $n_2$ is 2 or 3.

In a particular aspect, the cross-linking agent can have the chemical structure of Formula (2), wherein x, y, and z is 5 or 6, and a degree of —$CH_2OCH_3$ is at least 5.7 per mol.

In one aspect, the thickness of the adhesion layer of the multi-layer structure can be at least 2 nm and not greater than 100 nm.

In yet a further aspect, the solid polymeric layer of the multi-layer structure can be an imprint resist layer adapted for a nanolithographic process.

In another aspect, a method of attaching a resist layer to a substrate can comprise: applying a liquid adhesion composition on a surface of the substrate, the liquid adhesion composition comprising at least one polymerizable compound including at least two functional groups; a solvent; a catalyst; and a cross-linking agent, the cross-linking agent having a structure of Formula (1), wherein A is an alkyl or an aromatic group; X is $C_{1-5}$ alkyl, Y is $C_{1-4}$ linear or branched alkyl; $n_1$ is 1-10; R is $C_{1-6}$ alkyl; and $n_2$ is 1-6; curing the liquid adhesion composition by cross-linking the polymerizable compound with the cross-linking agent to form a solid adhesion layer; applying a liquid resist layer directly on top of the solid adhesion layer; and curing the liquid resist layer to form an imprint layer.

In a further aspect, the cross-linking agent of Formula (1) used in the method can have a structure wherein A is $C_{1-3}$ alkyl, Y is branched $C_{3-5}$ alkyl; R is $C_{1-3}$ alkyl, $n_1$ is 2-6, and $n_2$ is 2 or 3.

In a particular aspect, the cross-linking agent used in the method can have the chemical structure of Formula (2), wherein x, y, z is 5 or 6, and a degree of —$CH_2OCH_3$ is at least 5.7 per mol.

In another embodiment, a method for forming a photo-cured product pattern can comprise forming a solid adhesion layer by applying the liquid adhesion composition described above onto a substrate and curing the liquid adhesion composition; applying a photocurable composition to the substrate having the solid adhesion layer; bringing the photocurable composition into contact with a mold having an original pattern to be transferred; irradiating the photo-curable composition with light to form a photo-cured product; and removing the mold from the photo-cured product.

In yet a further embodiment, a method for manufacturing a circuit board can comprise forming a photo-cured product pattern as described above; working the substrate by etching or ion implantation using the patterned film as a mask; and forming an electronic member. In one aspect, the circuit board can be a semiconductor element.

BRIEF DESCRIPTION OF THE DRAWINGS

Embodiments are illustrated by way of example and are not limited in the accompanying figures.

Figure 1:
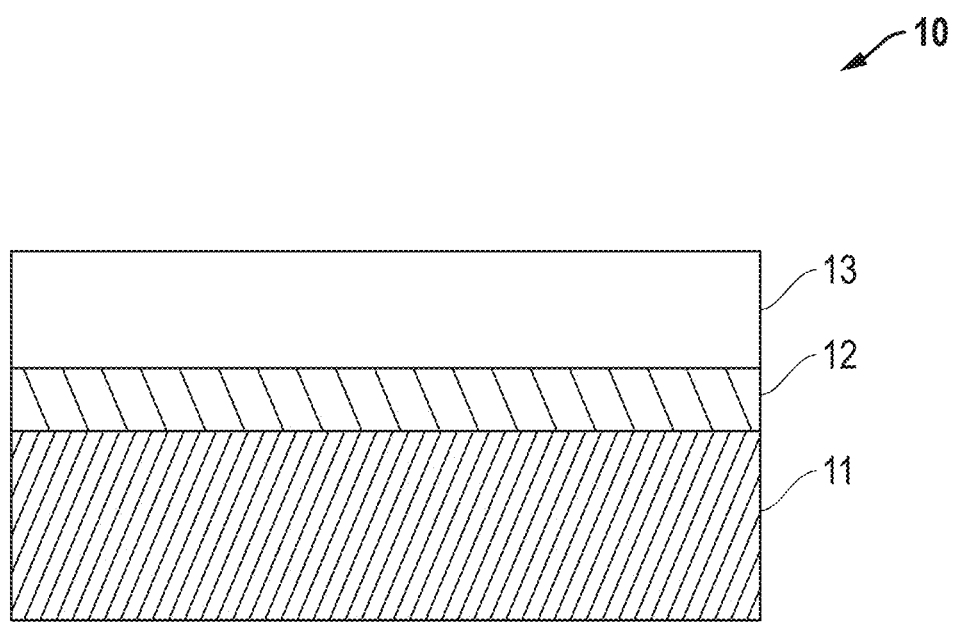
FIG. 1 includes an illustration of a multi-layer structure according to one embodiment.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

As used herein, the terms alkyl group or aryl group or aromatic group are used to encompass groups having no substituents (e.g., an unsubstituted alkyl group) but can also include substituted groups (e.g., a substituted alkyl group).

In one embodiment, the present disclosure is directed to a liquid adhesion composition which can comprise at least one polymerizable compound including at least two functional groups, a solvent, a catalyst, and a cross-linking agent. The liquid adhesion composition can be stable at room temperature (25° C.) and may not cure during longer storage time. In one aspect, the liquid adhesion composition can be subjected to curing at elevated temperatures. A particular use of the liquid adhesion composition of the present disclosure can be in nanoimprint lithography. In one aspect, the liquid adhesion composition can be spin-coated on a wafer substrate, cured and employed for attaching a resist layer to the wafer substrate.

The cross-linking agent of the liquid adhesion composition can have the structure of Formula (1):

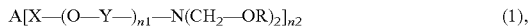

$$A[X-(O-Y-)_{n1}-N(CH_2-OR)_2]_{n2} \qquad (1),$$

wherein A can be an alkyl-group, an aromatic group, or a heteroaromatic group; X can be $C_{1-5}$ alkyl, Y can be $C_{1-4}$ linear or branched alkyl; $n_1$ can be 1-10; R can be $C_{1-6}$ alkyl, wherein each R can be the same or different; and $n_2$ can be 1-6. Non-limiting examples of aromatic groups can be substituted or unsubstituted benzyl or naphthyl ring structures. A heteroaromatic group can be, for example, a melamine-ring. As used herein, alkyl can mean substituted or unsubstituted alkyl groups. In a certain aspect, A can be a $C_{1-3}$ alkyl group, Y can be branched $C_{3-5}$ alkyl; R can be methyl or ethyl, $n_1$ can be 2-6, and $n_2$ can be 2 or 3. In a particular embodiment, the cross-linking agent can have the structure of Formula (2):

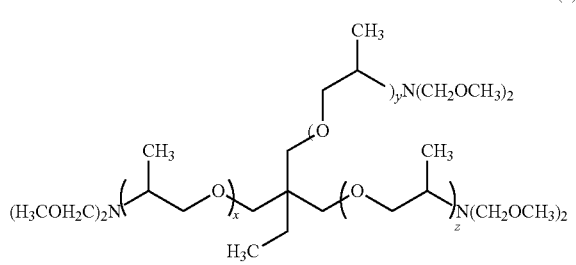

(2)

wherein x, y, z is 5 or 6, and a degree of —CH$_2$OCH$_3$ is at least 5.7 per mol.

As can be seen in Formula 1 or Formula 2, the cross-linking agent can include protective alkoxymethyl groups which may prevent or block the cross-linking agent to react with the functional groups of the polymerizable compound at room temperature. In a particular embodiment, the cross-linking agent can be substantially free of reactive functional groups at room temperature, for example, substantially free of NH$_2$, NH, or OH groups, and these functional groups may be protected by alkoxymethyl groups. As used herein, the phrase "the cross-linking agent being substantially free of functional groups" is intended to mean that the actual degree of alkoxymethylation ($DB_a$) is at least the maximum possible degree of alkoxymethylation ($DB_{max}$) multiplied with factor 0.95, i.e., $DB_a \geq DB_{max} \times 0.95$. Applied to Formula 2, which shows a maximum possible degree of methyoxymethylation $DB_{max}$ of 6, the actual degree of methoxymethylation $DB_a$ may be at least 6×0.95=5.7 per mol, such as $DB_a$ can be at least 5.8, at least 5.85, at least 5.90, at least 5.95, at least 5.98, or at least 5.99 per mol.

A high degree of blocked functional groups of the cross-linking agent is desirable in nanoimprint lithography, since it can be an indication about the stability of the liquid adhesion composition at room temperature, wherein polymerization reactions between cross-linking agent and polymerizable compound are not wanted.

In one aspect, the cross-linking agent can be a liquid at room temperature (25° C.) and may be fully miscible with the solvent of the liquid adhesion composition.

The amount of cross-linking agent in the liquid adhesion composition can be at least 1 wt %, such as at least 5 wt %, at least 10 wt %, at least 15 wt %, or at least 20 wt % based on the total weight of the solutes. In another aspect, the amount of cross-linking agent may be not greater than 80 wt %, such as not greater than 50 wt %, not greater than 40 wt %, not greater than 30 wt %, or not greater than 25 wt %. The amount of cross-linking agent can be a value between any of the minimum and maximum values noted above.

As used herein, the term solute or solutes is intended to mean all components of the liquid adhesion composition which are dissolved in the solvent, such as the cross-linking agent, the catalyst, the polymerizable compound, and optional additives. In one aspect, the total amount of solutes based on a total weight of the liquid adhesion composition can be at least 0.2 wt %, such as at least 0.25 wt %, at least 0.3 wt %, at least 0.5 wt %, at least 1.0 wt %, at least 2 wt %, at least 3 wt % or at least 3.5 wt %. In another aspect, the total amount of solutes may be not greater than 15 wt %, such as not greater than 10 wt %, not greater than 7 wt %, not greater than 6 wt %, not greater than 5 wt %, not greater than 4.5 wt %, or not greater than 4 wt %.

In a particular aspect, the total amount of solutes in the liquid adhesion composition can correlate with the thickness of the liquid adhesion layer intended to be created. For example, a thin adhesion layer within a range of 5-10 nm can employ a total amount of 0.25 wt % to 0.8 wt %, while a thicker layer with a thickness range of 40 to 60 nm can employ an amount of total solutes between 2 wt % and 4.5 wt %. In a certain embodiment, the amount of total solutes of the liquid adhesion composition can increase in an about direct proportion with the increase of the intended thickness of the adhesion layer to be made.

In another aspect, a weight percent ratio of the amount of the polymerizable compound to the amount of cross-linking agent can be at least 0.5, such as at least 1.0, at least 1.5, at least 2, at least 5, at least 10, or at least 12. In yet another aspect, the weight percent ratio amount of polymerizable compound to cross-linking agent can be not greater than 20, such as not greater than 15, or not greater than 13.

In a further aspect, the total amount of polymerizable compound and cross-linking agent together in the liquid adhesion composition can be at least 0.02 wt %, such as at least 0.05 wt %, at least 0.1 wt %, at least 0.3 wt %, at least 0.5 wt %, at least 1.0 wt %, at least 2.0 wt %, at least 4.0 wt %, or at least 6.0 wt %. In another aspect, the total amount of polymerizable compound and cross-linking agent may be not greater than 10 wt %, not greater than 8 wt %, or not greater than 7 wt %.

The catalyst of the liquid adhesion composition of the present disclosure can be adapted that it initiates curing of the composition at elevated temperatures. In one aspect, the catalyst can be a thermal acid generator, hereinafter called "TAG catalyst," which can release a free acid at a certain elevated temperature. In one aspect, the TAG catalyst can be active at a temperature of at least 50° C., such as at least 90° C., at least 100° C., at least 110° C., at least 120° C., at least 130° C., at least 140° C., at least 150° C., or at least 160° C. Non-limiting examples of TAG catalysts can be K-Kure TAG 2678, CXC-1821, or Cycat 4040. The catalyst of the present disclosure may not be limited to a TAG catalyst and any other type of catalyst which can initiate a cross-linking reaction at elevated temperature may be included in the liquid adhesion composition.

In another aspect, the catalyst contained in the liquid adhesion composition can be activated by UV radiation to initiate polymerization reactions.

In one embodiment, the catalyst can be present in the liquid adhesion composition in an amount of at least 0.05 wt % based on the total weight of the solutes, such as at least 0.1 wt %, at least 0.5 wt %, or at least 1 wt % based on the total weight of the solvent. In another embodiment, the amount of catalyst may be not greater than 6 wt % based on the total weight of the solutes, such as not greater than 5 wt %, not greater than 4 wt %, or not greater than 3 wt % based on the total weight of the solutes. The amount of catalyst can be a value between any of the minimum and maximum values noted above.

The polymerizable compound of the liquid adhesion composition can comprise at least two functional groups and can include a monomer, an oligomer, a polymer, or any combination thereof. Non-limiting examples of reactive functional groups can be a hydroxyl group, a carboxyl group, an amino group, an imino group, a (meth)acryloyl group, an epoxy group, an oxetanyl group, or a maleimide group. Such functional groups can be included, e.g., in alkyd resins, polyester resins, acrylic resins, acrylic-alkyd hybrids, acrylic-polyester hybrids, substituted polyether polymers, substituted polyolefin polymers, polyurethane polymers or co-polymers thereof.

In a certain embodiment, the polymerizable compound can include an acrylate oligomer. In a particular embodiment, the polymerizable compound can be an acrylate oligomer having a structure of Formula (3):

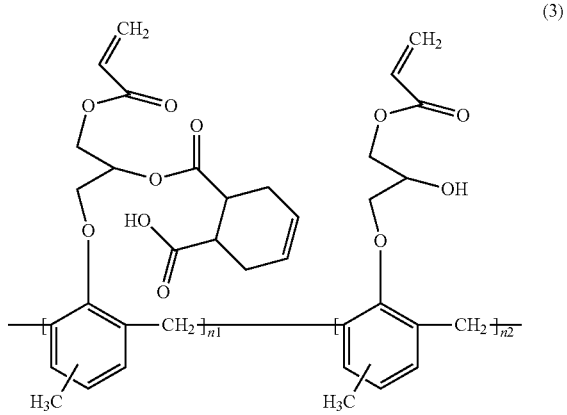

(3)

wherein $n_1+n_2>2$.

The amount of polymerizable compound in the liquid composition can be at least 5 wt % based on the total weight of the solutes, such as at least 10 wt %, at least 15 wt %, or at least 20 wt %. In another aspect, the amount of polymerizable compound may be not greater than 95 wt %, such as not greater than 90 wt %, not greater than 85 wt % based on the total weight of the solutes. The amount of polymerizable compound can be a value between any of the minimum and maximum values noted above.

The solvent of the liquid adhesion composition of the present disclosure can be any solvent which provides good solubility of all the ingredients of the composition, particularly the polymerizable compound, the cross-linking agent and the catalyst. Non-limiting examples of suitable solvents can be propylene glycol methyl ether acetate (PGMEA), propylene glycol methyl ether (PGME), cyclohexanol, or any combination thereof.

In a further aspect, the liquid adhesion composition can contain at least one optional additive. Non-limiting examples of optional additives can be surfactants, dispersants, stabilizer, co-solvents, initiators, inhibitors, or any combination thereof.

The liquid adhesion composition of the present disclosure can have an exceptional stability at room temperature over a large period of time. It is a known problem in nanoimprint lithography, that cross-linking agents may be active to a certain degree already at room temperature and can cause unwanted polymerization reactions during storage. This is especially of disadvantage when applying the liquid adhesion composition by spin coating on a wafer substrate. Unwanted particles can precipitate in the tube or nozzle, which often requires lots of flushing before operating the tubes. Moreover, unwanted particles can be formed on the wafer substrate and lead to quality problems of the coatings. The liquid adhesion composition of the present disclosure can avoid the above-discussed problems. In one embodiment, the liquid adhesion composition can comprise per ml less than 50 particles with a particle size of greater than 200 nm, or less than 50 particles/ml with a particle size of greater than 150 nm, or less than 50 particles/ml with a particle size of greater than 100 nm, or less than 50 particles/ml with a particle size of greater than 80 nm.

In a further embodiment, the viscosity of the liquid adhesion composition can be at least 0.5 cP, such as at least 1 cP, at least 1.5 cP, at least 2.0 cP, at least 2.5 cP, at least 3 cP, at least 5 cP, at least 10 cP, at least 15 cP, at least 20 cP, or at least 30 cP. In another embodiment, the viscosity can be not greater than 100 cP, such as not greater than 70 cP, not greater than 50 cP, not greater than 40 cP, or not greater than 30 cP. The viscosity of the liquid adhesion composition can be a value between any of the minimum and maximum values noted above.

The present disclosure is further directed to a multi-layer structure which employs the above-described liquid adhesion composition in a cured stage as a solid adhesion layer. In one embodiment, as illustrated in FIG. 1, the multi-layer structure (10) can comprise a substrate (11), a solid adhesion layer (12) directly overlying a surface of the substrate; and a solid polymeric layer (13) directly overlying a surface of the adhesion layer. The solid adhesion layer can correspond to the liquid adhesion composition described above after crosslinking the polymeric compound with the cross-linking agent.

The thickness of solid adhesion layer (12) of the multi-layer structure can be at least 1.5 nm, such as at least 5 nm, at least 8 nm, at least 10 nm, at least 15 nm, or at least 20 nm. In another aspect, the thickness of the solid adhesion layer can be not greater than 100 nm, such as not greater than 80 nm, not greater than 50 nm, not greater than 40 nm, not greater than 30 nm, or not greater than 25 nm. The thickness of the solid adhesion layer can be a value between any of the minimum and maximum values noted above.

The substrate (11) of the multi-layer structure can include silicon, silica, glass, metal, a metal alloy, a ceramic material, or any combination thereof. In a particular embodiment, the substrate can be a silicon wafer.

The solid adhesion layer (12) of the multi-layer structure can attach the solid polymeric layer (13) to the substrate (11). In a particular embodiment, the solid polymeric layer of the multi-layer structure can be an imprint resist layer attached to a wafer substrate adapted for a nanolithographic process. Non-limiting examples of the material of the solid polymeric layer can be UV cured acrylate and/or methacrylate based imprinting resists.

In one embodiment, a separation energy for separating a template from the polymeric layer after being patterned and cured can be at least 0.8 mJ, such as at least 0.85 mJ, at least 0.9 mJ, or at least 0.95 mJ.

The contact angle of a liquid resist to the applied surface is an important parameter in nanoimprinting, since it affects the drop spreading of the resist and the further performance during processing. As a general rule can be applied that the smaller the contact angle the faster the drop spreading. In one aspect, the contact angle of a liquid resist dropped on the solid adhesion layer of the present disclosure can be not greater than 30 degrees, such as not greater than 25 degrees, not greater than 20 degrees, not greater than 15 degrees, or not greater than 10 degrees. In a particular embodiment, the contact angle can be not greater than 20 degrees within a time period of 0.1 seconds to 1.5 seconds.

In another aspect, particularly when the polymeric layer is an imprint resist layer, a maximum thickness of the polymeric layer after patterning and curing the liquid resist can be between 40 nm and 200 nm, wherein the residual layer thickness may be at least 5 nm, such as at least 10 nm, at least 15 nm, at least 20 nm, or at least 30 nm.

In a further embodiment, the present disclosure is directed to a method of attaching a resist layer to a substrate. The method can comprise the following steps: applying the liquid adhesion composition described above on a surface of a substrate; curing the liquid adhesion composition to form a solid adhesion layer; applying a liquid resist layer directly on top of the solid adhesion layer; and curing the liquid resist layer.

In a certain embodiment, applying the liquid adhesion composition to a surface of the substrate can be conducted by spin coating. The liquid adhesion composition may be adapted that during spin-coating a continuous and even liquid layer of the liquid adhesion layer can be formed.

In a further embodiment, after applying the adhesion layer on the substrate surface and before applying the liquid resist layer, the liquid adhesion composition can be cured. In one embodiment, the liquid adhesion composition can be cured by heat treatment. During heat treatment, the catalyst contained in the liquid adhesion composition may cause cross-linking reactions between the cross-linking agent and the polymeric compound of the liquid adhesion composition. Curing of the liquid adhesion composition can also include forming of a bond chemistry with the underlying substrate surface. The temperature during heat treatment may depend on the temperature at which the catalyst can become active, e.g., by releasing an acid which can cause the cross-linking reaction (see description of suitable catalysts above). Heat treating can be conducted, for example, by heating the substrate to the required temperature on a hotplate or in an oven.

After curing of the liquid adhesion composition to form a solid adhesion layer (12), a liquid resist layer (13) can be applied directly over the solid adhesion layer (12). In a particular embodiment, the liquid resist layer (13) can be applied by ink-jetting in a J-FIL nanoimprinting process. Depending on the material of the liquid resist layer, curing can be also conducted by heat treatment, or a combination of UV radiation and heat treatment. In one embodiment, the liquid resist layer can be cured by UV radiation.

In another embodiment, the present disclosure is directed to a method of forming a photo-cured product pattern. The method can comprise forming a solid adhesion layer by applying the liquid adhesion composition described above onto a substrate and curing the liquid adhesion composition. Thereafter, a photocurable composition (for example, a liquid imprint resist) can be applied on top of the solid adhesion layer and a mold may be brought in contact with the photocurable composition such that the photocurable composition can fill the mold. The mold may contain an original pattern to be transferred, hereinafter also called relief pattern. After the photocurable composition has filled the mold, the photocurable composition can be radiated with light, for example, UV light, to form a photo-cured product. After curing of the photocurable composition, the mold can be removed from the photo-cured product.

In the above-described process, the photo-cured product pattern can have a desired relief pattern (derived from the relief pattern of the mold) in a desired position, and thus, an article having the photo-cured product pattern can be obtained.

The photo-cured product pattern may be used as an interlayer insulating film of a semiconductor device, such as LSI, system LSI, DRAM, SDRAM, RDRAM, or D-RDRAM, or as a resist film used in a semiconductor manufacturing process.

In the embodiment wherein the photo-cured product pattern is used as a resist film, the photo-cured product pattern can function as an etching mask. In a particular aspect, the substrate can contain electronic members and a circuit structure can be formed on the substrate according to the profile of the photo-cured product pattern. Thus, a circuit board used in a semiconductor device or the like can be produced. The resulting circuit board may be connected to a control mechanism for the circuit board for producing an electronic component of a display, a camera, a medical apparatus, or any other apparatus.

Similarly, the photo-cured product pattern may be used as a resist film for etching and/or ion implantation in a process for manufacturing an optical component or a device component, such as a flow channel structure of microfluidics and a patterned medium structure.

Although etching and ion implantation have been described in embodiments as the method for etching the substrate using the photo-cured product pattern as a mask, the method is not limited to these. For example, plating may be performed on the substrate provided with the photo-cured product pattern. In a process for manufacturing a circuit-including substrate or an electronic component, the photo-cured product pattern may be finally removed from the substrate, or may be left as a member of a device.

EXAMPLES

The following non-limiting examples illustrate the concepts as described herein.

Example 1

Synthesis of Cross-Linking Agent.

A mixture of 440 g of a polyetheramine having three primary amine groups (Jeffamine T-403 from Huntsman), 300 g of formaldehyde, 190 g of methanol, 55 g of water, and 10 g of 10% NaOH solution was added to a reaction vessel. The mixture was stirred and heated under reflux to a temperature of 83° C. whereby a homogenous solution was formed. The solution was further heated to a temperature of 87° C. and 500 g of methanol was added. After adding of the methanol, the solution was maintained at 87° C. for further 10 minutes and thereafter cooled down to room temperature. During cooling a solid precipitate was formed. The solid precipitate was separated and mixed with 950 g of methanol and 50 g of nitric acid. This mixture was stirred and allowed to react for 30 min at room and thereafter 150 g $NaHCO_3$+20 g $Na_2CO_3$ was added to neutralize the mixture. Thereafter, methanol was removed from the mixture by distillation and the remaining product was washed with xylene and dried under vacuum. The obtained product was a viscous liquid, and is called hereafter cross-linking agent CA-M6, which structure is shown in Formula 2.

The degree of methoxymethylation of cross-linking agent CA-M6 was analyzed with H-NMR and ultra performance liquid chromatography (UPLC) analysis. The analysis measured degree of methoxymethylation was 6.0, which is the maximum possible methoxymethylation degree for the employed polyetheramine starting material, and means that each of the three primary amine groups contained two methoxymethyl groups as protective groups.

Example 2

Preparation of liquid adhesion composition including cross-linking agent CA-M6 and forming of solid adhesion layer.

A liquid adhesion composition (Sample 51) was prepared including as polymerizable compound Isorad 501-20 from Schenectady International (20% in PGMEA) in an amount of 0.607 g, as cross-linking agent CA-M6 of Example 1 (2% in PGMEA) in an amount of 1.94 g, TAG catalyst Tag2678 from King Industries (0.2% in PGMA) in an amount of 0.8 g, and as solvent 47.82 g PGMEA.

The composition was mixed in a roller mixer for two hours at room temperature, and thereafter was spin-coated as a thin liquid film on a bare silicon wafer by a Brewer coater at 1500 rpm. The viscosity of the liquid adhesion composition, measured by a Brookfield Viscometer after mixing and before spin-coating was 1.1 cP at a temperature of 23° C. The measurement was conducted with spindle #18 at 135 rpm spin speed, at 23° C. An amount of 7 ml liquid was used to ensure to cover the spindle head.

The silicon wafer was heated to a temperature of 220° C. and the liquid film was cured for 90 seconds to form a solid adhesion layer, hereinafter called SS1. After curing, the film was cooled to room temperature and washed with PGMEA and dried. The thickness of the formed solid adhesion layer SS1 (measured by Ellipsometer) was 4.2 nm before washing with PGMEA, and 4.2 nm after washing with PGMEA. The constant thickness after washing with PGMEA indicated that the cross-linking reaction was complete and no significant amounts of materials could be removed by washing with the solvent.

Example 3

Preparing of Comparative Liquid Adhesion Composition and Forming of Comparative Solid Adhesion Layer.

A comparative liquid adhesion composition was prepared (Sample C1) by making the same mixture as in Example 1, except that the cross-linking agent was replaced with Cymel 303 from Cytec Industries in an amount of 1.94 g (2% in PGMEA). Cymel 303 contains the known cross-linking agent hexamethoxymethylmelamine (HMMM), which is methoxymethylated melamine (see Formula 4).

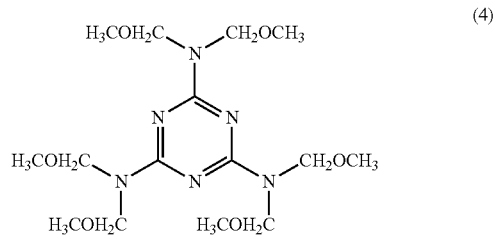

(4)

The mixture was mixed for two hours in the roller mixer at room temperature, and thereafter spin-coated in form of a thin liquid film on a bare silicon wafer by a Brewer coater at 1500 rpm. The viscosity of the liquid adhesion composition after mixing and before spin-coating was 1.1 cP at 23° C. The coated silicon wafer was heated to a temperature of 180° C. and the liquid film was cured for 90 seconds. The thickness of the cured film, hereinafter called SC1, was 5.5 nm (measured by Ellipsometer). The comparative liquid adhesion composition has been already used in commercial manufacturing and was known to cure completely under the applied conditions, wherefore washing and re-measuring the thickness of the solid adhesion layer was omitted.

Example 4

Comparison of Contact Angles Between Liquid Resist and Solid Adhesion Layers SS1 and SC1.

The contact Angle was measured with a KYOWR Contact Angle Meter DropMaster DM-701. For the testing, a 2 μl amount of liquid resist was dispensed onto the solid surface of the cured solid adhesion layer and allowed to spread and to form a drop shape. A CCD camera was used for imaging the drop profile and the data were recorded at a rate of 0.1 s/frame. The contact angle θ at different time points was measured by the software automatically. The contact angle value can indicate the wettability of the liquid to the solid surface.

Figure 2:
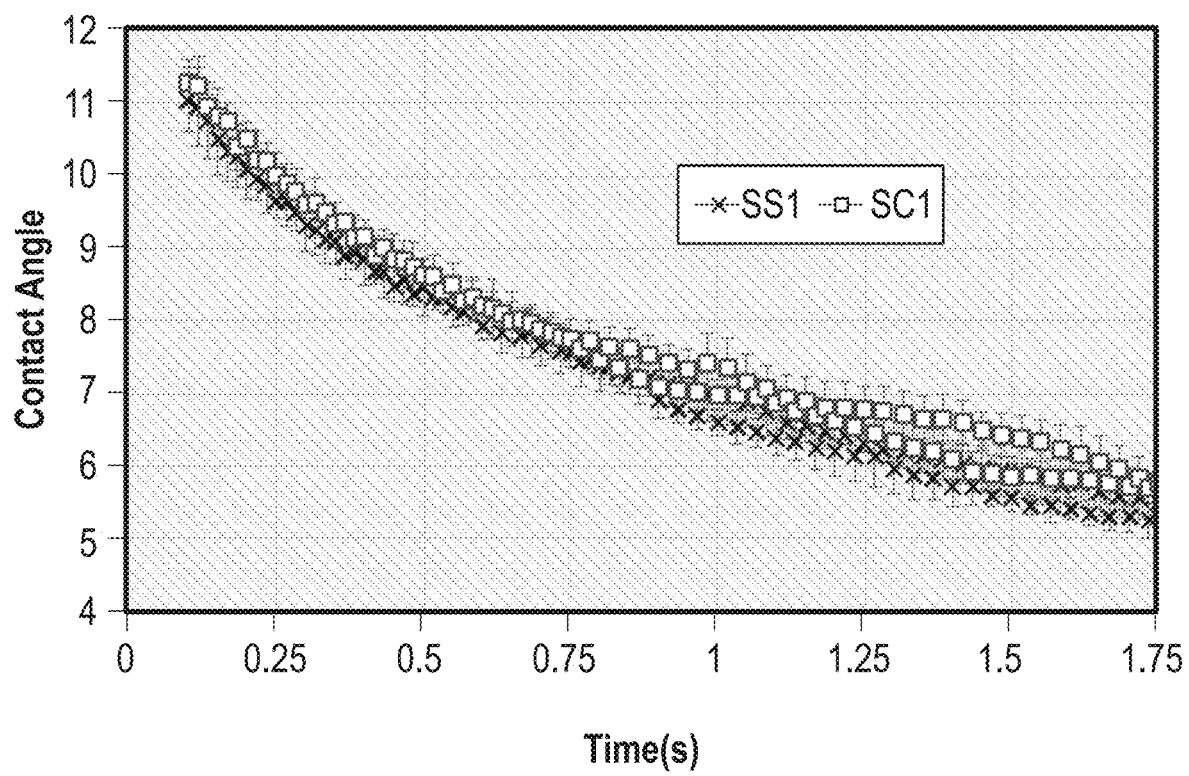
FIG. 2 includes a graph illustrating the contact angle of an imprint resist applied on a solid adhesion layer according to one embodiment and comparing with control sample.

A UV curable acrylate-based liquid imprint resist layer consisting of two monofunctional acrylates, one difunctional acrylates as the crosslinker, photoinitiators, and surfactants having a viscosity of 6 cP was dropped on the surface of the solid adhesion layer SS1 and solid adhesion layer SC1. As illustrated in FIG. 2, low contact angles in a range from 11 degrees to 5 degrees during a time frame from 0.1 seconds to 1.75 seconds could be observed on both types of solid adhesion layers, SS1 and SC1. The contact angle was slightly smaller for liquid resist dropped on the solid adhesion layer SS1, including CA-M6 as cross-linking agent.

Example 5

Comparison of Liquid Resist Drop Spreading

The liquid resist used in Example 4 was also used for testing the drop spreading on the solid adhesion layers SS1 and SC1. For the testing, single drops with a size of 3 pL were applied on the solid adhesion layers and the drop size on each layer measured after 0.5 seconds with an optical microscope. The average drop size on solid adhesion layer SS1, including CA-M6 as cross-linking agent, was 104.5 μm, which was slightly larger than the average drop size of 101.9 μm formed on comparative solid adhesion layer SC1, using HMMM as cross-linking agent. The larger drop size on the CA-M6 comprising layer corresponds to the lower contact angle on this layer measured in Example 4.

Example 6

Comparison of Separation Energy for Imprint Layer on SS1 and SC1.

A UV curable acrylate-based liquid imprint resist layer containing two monofunctional acrylates, one difunctional acrylate as the crosslinker, photoinitiator, and surfactant was applied on the solid adhesion layer SS1 (formed in Example 2) and on the solid adhesion layer SC1 (formed in Example 3). The applied liquid resist layers were cured by UV radiation. The residue layer thickness of each of the cured imprint resist layers on SS1 and SC1 was 15 nm. A pre-patterned template was used to test the separation energy to separate the template from the cured imprint resist. For the testing, an amount of 3 μL of the liquid resist was applied by a piezoelectric print head onto the solid adhesion layer SS1 and SC1, and the template was pressed on the liquid resist to let the liquid to fill in the trenches. Thereafter, the liquid resist contained in the template mold was exposed to UV radiation to solidify. Finally, the template was separated from the cured resist, leaving the patterned resist on the adhesion layer. During the separation process, the separation force and time was recorded, and the separation energy calculated by the imprinting tool.

Table 1 includes a summary of measured separation energy values at different locations of the imprint resist layers. It can be seen that the separation energy for both samples, having underlying solid adhesion layers SS1 and SC1, was within a range of 0.85 mJ and 1 mJ. For both tested samples, the separation of the template from the imprint resist layer were complete without any adhesion failure between the adhesion layer to the silicon substrate and also without adhesion failure between the adhesion layer and the cured imprint resist.

TABLE 1

| Sample | Separation Energy [mJ] | | | | | | |
|---|---|---|---|---|---|---|---|
| SS1 | 0.98 | 0.97 | 0.96 | 0.97 | 0.99 | 0.97 | 0.98 |
| SC1 | 0.99 | 0.91 | 0.95 | 0.93 | 0.95 | 0.92 | 0.89 |

The comparative testing results of Examples 4, 5, 6 demonstrate that solid adhesion layer SS1 formed with cross-linking agent CA-M6 is comparable with known solid adhesion layers made with commercial cross-linking agent HMMM.

In comparison to hexamethoxymethylmelamine (HMMM) contained as cross-linking agent in the comparative liquid adhesion composition, the cross-linking agent of the liquid adhesion composition of the present disclosure has a structure which is much more flexible because of repeating oxypropylene units and non-ring structure (see, e.g., Formula 2). In contrast, HMMM has a conjugated 6-ring structure as the center of the molecule, wherein the functional amino groups (blocked with methoxymethyl groups) are directly covalently bonded to the three C atoms of the heterocyclic ring (see Formula 4) and is thereby very limited in its flexibility. The flexibility of the cross-linking agent of the present disclosure can be one reason that it is liquid at room temperature or at operation temperature, while HMMM is solid at these temperatures. Although both cross-linking agents are very soluble in the solvent, e.g. PGMEA, their behavior and stability is different. Especially when the solvent is diminished by evaporation, HMMM may precipitate in the composition and form particles. This can be more severe in the dispensing tube and nozzle when installed on a spin coater line, especially in the opening of the nozzle, and these particles may cause coating defects. To regenerate the cleanliness of the adhesion coating fluid, an excess amount of solvent and solution is often required to flush the dispensing tube and nozzle, resulting in waste of time and material and reduction of throughput. It is further known that HMMM is very difficult to make having a maximum degree of methoxymethylation of 6. HMMM in commercial products typically has a methoxylation degree of 5.1, which allows the unprotected functional groups to cause unwanted polymerization reactions.

For the reasons discussed above, the liquid adhesion composition of the present disclosure employing a cross-linking agent of Formula 1 can be superior in comparison to commercially known adhesion compositions, wherein the cross-linking agent can cause unwanted particle or gel formation during processing or storage.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A liquid adhesion composition comprising:
   at least one polymerizable compound comprising at least two functional groups;
   a catalyst;
   a solvent, and
   a cross-linking agent, wherein the cross-linking agent has a structure of formula (1):

$$A[X-(O-Y-)_{n_1}-N(CH_2-OR)_2]_{n_2} \quad (1),$$

wherein A is an alkyl group, an aromatic group or a heteroaromatic group; X is $C_{1-5}$ alkyl, Y is $C_{1-4}$ linear or branched alkyl; $n_1$ is 1-10; R is $C_{1-6}$ alkyl, wherein each R is the same or different; $n_2$ is 1-6.

2. The liquid adhesion composition of claim 1, wherein A is a $C_{1-3}$ alkyl, Y is branched $C_{3-5}$ alkyl; R is $C_{1-3}$ alkyl, $n_1$ is 2-6, and $n_2$ is 2 or 3.

3. The liquid adhesion composition of claim 2, wherein the cross-linking agent has a structure of formula (2):

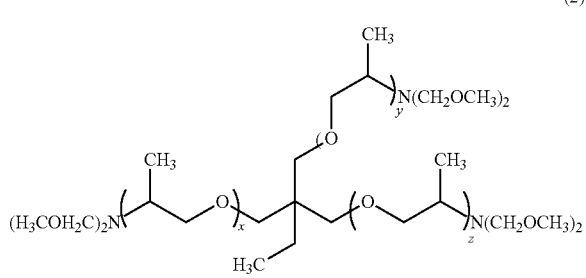

wherein x, y, z is 5 or 6, and a degree of —$CH_2OCH_3$ is at least 5.7 per mol.

4. The liquid adhesion composition of claim 1, wherein the at least one polymerizable compound comprises a monomer, an oligomer, a polymer, or any combination thereof.

5. The liquid adhesion composition of claim 4, wherein the polymerizable compound includes an acrylate oligomer.

6. The liquid adhesion composition of claim 1, wherein the liquid adhesion composition comprises per ml less than 50 particles with a particle size of greater than 200 nm.

7. The liquid adhesion composition of claim 1, comprising a viscosity of not greater than 100 cP.

8. The liquid adhesion composition of claim 1, wherein the composition is curable at a temperature of at least 50° C.

9. The liquid adhesion composition of claim 1, wherein a weight percent ratio of the amount of the polymerizable compound to the cross-linking agent is at least 0.5 and not greater than 20.

10. The liquid adhesion composition of claim 1, wherein a combined amount of the polymerizable compound and the cross-linking agent together is at least 0.02 wt % and not greater than 10 wt %.

11. The liquid adhesion composition of claim 1, wherein the solvent comprises propylene glycol methyl ether acetate (PGMEA), propylene glycol methyl ether (PGME), cyclohexanol, or a combination thereof.

12. A method of forming a photo-cured product pattern, comprising:
   forming a solid adhesion layer by applying the liquid adhesion composition of claim 1 onto a substrate and curing the liquid adhesion composition;
   applying a photocurable composition to the substrate, wherein the photocurable composition is overlying the solid adhesion layer;
   bringing the photocurable composition into contact with a mold having an original pattern to be transferred;
   irradiating the photocurable composition with light to form a photo-cured product; and
   removing the mold from the photo-cured product.

13. A method for manufacturing a circuit board, the method comprising:
   forming a patterned film by the method as set forth in claim 12;
   working the substrate by etching and/or ion implantation using the patterned film as a mask; and
   forming an electronic member.

14. The method according to claim 13, wherein the circuit board is a semiconductor element.

15. A multi-layer structure, comprising:
   a substrate,
   a solid adhesion layer directly overlying a surface of the substrate; and
   and a solid polymeric layer directly overlying a surface of the adhesion layer,
   wherein the solid adhesion layer comprises an oligomer or polymer crosslinked by a cross-linking agent, the a cross-linking agent having a chemical structure of formula (1)

$$A[X-(O-Y-)_{n_1}-N(CH_2-OR)_2]_{n_2} \quad (1),$$

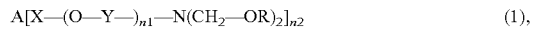

wherein A is an alkyl group, or an aromatic group, or an heteroaromatic group; X is $C_{1-5}$ alkyl; Y is $C_{1-4}$ linear or branched alkyl; $n_1$ is 1-10; R is $C_{1-6}$ alkyl, wherein each R is the same or different; $n_2$ is 1-6.

16. The multi-layer structure of claim 15, wherein A is a $C_{1-3}$ alkyl group, Y is branched $C_{3-5}$ alkyl; R is $C_{1-3}$ alkyl, $n_1$ is 2-6, and $n_2$ is 2 or 3.

17. The multi-layer structure of claim 16, wherein the cross-linking agent has a chemical structure of formula (2):

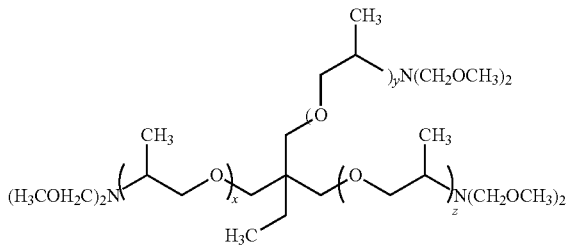

wherein x, y, z is 5 or 6, and a degree of —$CH_2OCH_3$ is at least 5.7 per mol.

18. The multi-layer structure of claim 15, wherein a thickness of the adhesion layer is at least 2 nm and not greater than 100 nm.

19. The multi-layer structure of claim 15, wherein the solid polymeric layer is an imprint resist layer adapted for a nanolithographic process.

* * * * *

UNITED STATES PATENT AND TRADEMARK OFFICE
CERTIFICATE OF CORRECTION

PATENT NO. : 10,780,682 B2
APPLICATION NO. : 16/228228
DATED : September 22, 2020
INVENTOR(S) : Fen Wan et al.

Page 1 of 1

It is certified that error appears in the above-identified patent and that said Letters Patent is hereby corrected as shown below:

In the Specification

Column 12, Line 61, please delete "3 µL", and insert --3 pL--

Signed and Sealed this
Twenty-seventh Day of September, 2022

Katherine Kelly Vidal
*Director of the United States Patent and Trademark Office*